(12) United States Patent
Yoshioka (10) Patent No.: US 6,261,744 B1
(45) Date of Patent: Jul. 17, 2001

(54) BAKING APPARATUS AND BAKING METHOD

(75) Inventor: Kazutoshi Yoshioka, Kumamoto-ken (JP)

(73) Assignee: Tokyo Electron Limited, tokyo (JP)

( * ) Notice: Subject to any disclaimer, the term of this patent is extended or adjusted under 35 U.S.C. 154(b) by 0 days.

(21) Appl. No.: 09/371,518

(22) Filed: Aug. 10, 1999

Related U.S. Application Data (62) Division of application No. 09/005,188, filed on Jan. 9, 1998, now Pat. No. 6,002,108.

(30) Foreign Application Priority Data

Jan. 16, 1997 (JP) .................................................. 9-017760

(51) Int. Cl.$^7$ ...................................................... G03C 5/00
(52) U.S. Cl. ............................ 430/325; 430/327; 430/330
(58) Field of Search ..................................... 430/325, 327, 430/330

(56) References Cited

U.S. PATENT DOCUMENTS

| | | |
|---|---|---|
| 5,143,552 | 9/1992 | Moriyama . |
| 5,227,281 | 7/1993 | Gaschler et al. . |
| 5,429,910 | 7/1995 | Hanawa . |
| 5,664,254 | 9/1997 | Ohkura et al. . |
| 5,667,942 * | 9/1997 | Nakao et al. .................. 430/327 |
| 5,994,036 * | 11/1999 | Itoh ................................ 430/330 |
| 6,002,108 * | 12/1999 | Yoshioka ........................ 219/388 |
| 6,051,371 * | 4/2000 | Mita et al. ..................... 430/330 |

FOREIGN PATENT DOCUMENTS 0 370 486   5/1990   (EP) .

* cited by examiner

*Primary Examiner*—Geraldine Letscher
(74) *Attorney, Agent, or Firm*—Oblon, Spivak, McClelland, Maier & Neustadt, P.C.

(57) ABSTRACT

The baking apparatus of the present invention comprises a casing surrounding a substrate W having a pattern-exposed resist film, a hot plate for heating the substrate in the casing, gas supply mechanisms for supplying a $H_2O$ component containing humidity gas into the casing. The $H_2O$ component included in the humidity gas is allowed to react with the resist film by introducing the humidity gas into the casing while the substrate is being heated by the hot plate, thereby rendering either an irradiate portion or a non-irradiate portion of the resist film, soluble in alkali.

6 Claims, 5 Drawing Sheets

BAKING APPARATUS AND BAKING METHOD

This appln is a divisional of Ser. No. 09/005,188 filed Jan. 9, 1998 U.S. Pat. No. 6,002,108.

BACKGROUND OF THE INVENTION

The present invention relates to a baking apparatus and a baking method for baking a resist film coated on a substrate such as a semiconductor wafer and an LCD substrate.

When a semiconductor device is manufactured, photolithgraphic technique is usually employed. In the manufacturing step using the photolithgraphic technique, the surface of a semiconductor wafer is coated with a photoresist, exposed to light together with a predetermined pattern, and developed. In this manner, a resist film having a predetermined pattern is formed on the wafer. If the resist film is further subjected to etching and film-formation steps, a circuit with a predetermined pattern can be formed. The aforementioned series of resist processing steps are usually performed in the coating/developing system, for example, disclosed in U.S. Pat. No. 5,664,254 publication. The series of resist processing steps include various baking processes performed for different purposes. Prebake is made to stabilize the resist. Post exposure bake (PEB) is carried out after the resist is exposed to light. After the resist is developed, post bake is performed.

With an increase in bit number from 64M to 256M in recent years, the line width of a DRAM circuit has been reduced to the sub micron order, e.g., 0.3 $\mu$m or less. With this tendency, the requirement for the quality of a resist film has become extremely stringent. To form such an ultra-fine pattern, highly sensitive, chemically amplified resists have been developed and put in wide use.

Since the light exposed portion of the chemically amplified resists initiates a chemical reaction in a post exposure baking step performed after the light exposure. Therefore, an ultra-fine pattern can be formed even by the radiation of a low energy laser such as a krypton fluoride eximer laser (wavelength: 248 nm). However, when the chemically amplified resist is subjected to the PEB using a conventional baking apparatus, it tends to be difficult to obtain the wiring with a constant width. As a result, a predetermined pattern cannot be formed and thus the yield of the semiconductor device decreases.

BRIEF SUMMARY OF THE INVENTION

An object of the present invention is to provide a baking apparatus and a baking method capable of forming a pattern having a line width in the order of sub micron. More specifically, the present invention is intended to provide a baking apparatus and baking method capable of forming an ultra fine pattern uniform in line width on a chemically amplified resist film.

The baking apparatus of the present invention comprises:

a casing surrounding a substrate having a pattern-exposed resist film;

a hot plate for heating the substrate in the casing; and a gas supply mechanism for supplying a $H_2O$ component containing humidity gas into the casing, in which the $H_2O$ component included in the humidity gas is allowed to react with the resist film by introducing the humidity gas in the casing while the substrate is being heated by the hot plate, thereby rendering either an irradiated portion or a non-irradiated portion of the resist film soluble in alkali.

It is preferable that the apparatus of the present invention further comprise a cover provided closely the substrate in the casing for forming a process space for baking the resist film between the cover and the substrate, and an elevator mechanism for elevating the cover. If such a small process space is formed between the cover and the substrate, $H_2O$ component contained in the humidity gas can be efficiently reacted with the resist film, with the result that a quality of the resist film is improved, increasing the throughput of the baking process.

The cover has a gas inlet at the center thereof and a gas outlet in the periphery thereof. It is preferable that the humidity gas be introduced through the gas inlet into the process space and exhausted through the gas outlet from the process space.

Furthermore, it is preferable that the baking apparatus have a plurality of lift pins for lifting the substrate above the hot plate.

It is preferable that the gas supply mechanism have a gas source and a humidifier for humidifying the gas supplied from the gas source and sending the gas to the casing.

It is further preferable that the humidifier have a pot for storing water, a cover provided over the pot, a first gas supply pipe inserted in the pot through the cover and connected to the gas source, and a second gas supply pipe inserted in the pot through the cover and connected to the casing.

It is yet preferable that the gas supply mechanism comprise a temperature controlling means for controlling temperature of the gas.

It is still preferable that the temperature controlling means have a first temperature controller provided upstream of the humidifier and a second temperature controller provided downstream of the humidifier, a temperature sensor provided downstream of the second temperature controller, and a controller for controlling the first and second temperature controllers separately on the basis of temperature detection signals sent from the temperature sensor. Furthermore, it is preferable that the humidifier have a fan for introducing a gas from the gas source, a chiller for removing humidity from the introduced gas by exchanging heat with a coolant, a heater for heating the humidity-removed gas by the chiller, and an evaporation plate for adding steam to the humidity-removed gas by the chiller.

A baking method according to the present invention comprises the steps of:

(a) forming a space around the substrate, for processing a substrate having a pattern-exposed resist film so as to isolate the substrate from the outside, (b) generating a $H_2O$ component containing humidity gas by adding steam to gas, and (c) heating the substrate while the humidity gas is being introduced into the space for processing to react the $H_2O$ component contained in the humidity gas with the resist film, thereby rendering either an irradiated portion or a non-irradiated portion of the resist film, soluble in alkali.

It is desirable that the substrate be heated to a temperature within the range of 80° C. to 170° C. and for 70 to 150 seconds.

It is further desirable that the humidity containing gas be generated by adding water vapor to an air or an inert gas such as a nitrogen gas, argon gas, or helium gas.

In the step (c), it is preferable that a relative humidity of the space for processing be controlled within the range of 30 to 50% by controlling an amount of the humidity gas.

In step (b), it is preferable that temperature of the humidity gas be controlled.

It should be noted that the resist film is formed of a chemically amplified resist containing an alkali-insoluble resin as a main component.

Now, we will explain the chemical reaction which takes place when the resist film is subjected to the PEB with reference to the formulas 1-1, 1-2, 2-1 and 2-2.

When a photoresist is exposed to light, $H^+$ is generated from a photoacid generator contained in the photoresist. Thereafter, when the wafer W is subjected to PEB, $H^+$ present at an irradiated portion cuts out an acetal group and isolated from polyhydroxystyrene (PHS). The polyhydroxystyrene (PHS) is soluble in alkali. On the other hand, the isolated acetal group presents in the form of a carbocation represented by a resonance structure (1) or (2). Since the carbocations (1) and (2) are labile intermediate products, they readily decompose and freshly generate $H^+$. The generated $H^+$ decomposes the carbocations. $H^+$ is thus consecutively generated in a chain reaction manner. As described, when the chemically amplified resist is subjected to PEB, $H^+$ is produced one after another. Therefore, even if the film is exposed to even low energy eximer laser, the resultant pattern is obtained with high sensitivity.

When the chemically amplified resist is subjected to the PEB process under the humidified atmosphere, $H_2O$ works actively to decompose the carbocation (1) or (2) as shown in the formulas 1-2 and 2-2. To explain more specifically, $H_2O$ reacts with the carbocation (1) or (2), converting it into a tautomer. The tautomer is further decomposed into alcohol and aldehyde. The decomposed products (alcohol and aldehyde) are easily vaporized, leaving alkali-soluble PHS alone. When an alkaline developing solution is applied to the portion substantially consisting of PHS, the resist is completely dissolved without debris. As a result, a clear-cut pattern is successfully obtained having a constant line width.

Formula 1-1

Formula 1-2

Formula 2-1 acetal-protected PHS
(alkali-insoluble)

Carbonium cation (2)

Formula 2-2

Carbonium cation (2)

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Now, preferable embodiments of the present invention will be explained with reference to the accompanying drawings.

Figure 1:
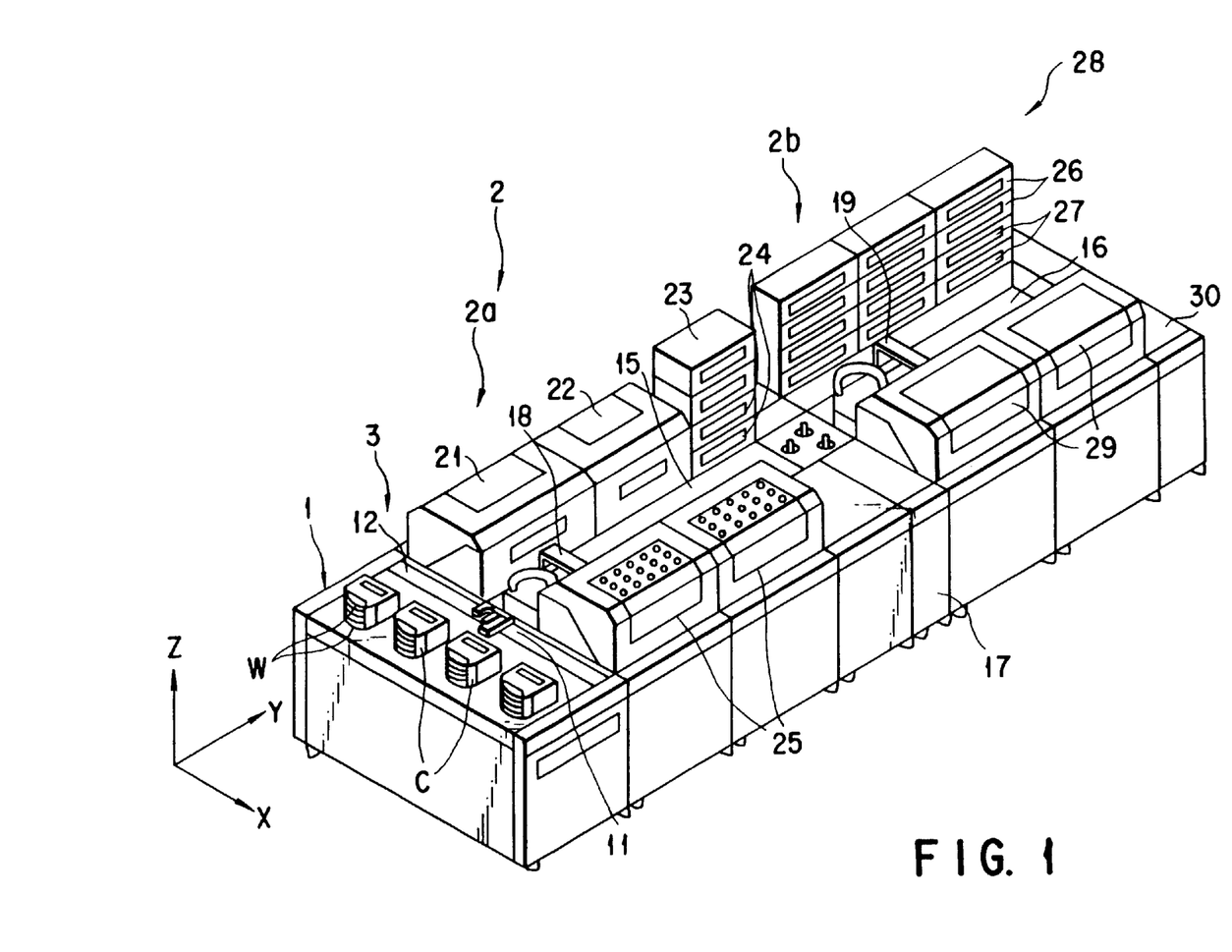
FIG. 1 is a perspective view of a resist coating/developing system having a baking apparatus of the present invention installed therein.

As shown in FIG. 1, the coating/developing system of the present invention comprises a cassette station 1, a process portion 2, and an interface portion 30. The system further comprises first and second main arm mechanisms 18, 19 and a sub arm mechanism 3 for use in transferring a wafer W. Four cassettes C are aligned along the X-axis on the cassette station 1. Each of the cassette C contains a plurality of semiconductor wafers W. The process portion 2 comprises a plurality of process units 21 to 29 for use in a series of resist processing applied to the wafer W.

The sub arm mechanism 3 comprises a transfer arm 11, for transferring the wafer, a transfer path 12 extending in the direction of the X-axis, and a moving mechanism (not shown) for moving the transfer arm 11 in every directions. The sub arm mechanism 3 plays a role in taking out the wafer W from the cassette C and transferring it to a first main arm mechanism 18 of the process portion 2.

The process portion 2 is divided into a front stage 2a and a back stage 2b. First and second passages 15 and 16 are formed in the center of these stages, respectively. The process units 21 to 29 are arranged on both sides of the first and second passages 15 and 16. A joint portion is interposed between the front stage 2a and the back stage 2b.

The front stage 2a has a first main arm mechanism 18 movable along the first passage 15. A brush washing unit 21, a water washing unit 22, an adhesion unit 23, and a cooling unit 24 are arranged on one side of the first passage 15. Two coating units 25 are arranged on the other sides. The back stage 2b has a main arm mechanism 19 movable along the passage 16. A thermal unit group 28 consisting of a plurality of baking units 26 and cooling units 27 is provided on one side of the second passage 16. Two developing units 29 are provided on the other sides. It should be noted that the thermal unit 28 comprises three sets of four-layer units 26, 27. The baking units 26 is formed of the upper two layers of each set. The cooling units 27 is formed of the lower two layers.

The baking unit 26 is used for baking process such as prebake for stabilizing the resist before light exposure, post exposure bake (PEB) after the light exposure, and post bake performed after development. An interface portion 30 is provided at the back end of the back stage 2b for transferring the wafer W to/from a light exposure apparatus (not shown).

The first main arm mechanism 18 is responsible not only for transferring the wafer W to/from the sub arm 11 but also for loading/unloading the wafer W into/from each of the units arranged on the front stage 2a. The first main arm mechanism 18 further serves for transferring the wafer W to/from the joint portion 17. The second main arm 19 is also responsible not only for transferring the wafer W to/from the joint portion 17 but also for loading/unloading the wafer W to/from each of the process units arranged on the back stage 2b. The second main arm 19 further serves for transferring the wafer W to/from the interface portion 30.

Since individual process units are collectively arranged in one place as mentioned above, saving space and efficient processing can be attained. The entire process portion 2 having individual process units in one place, is housed in a casing (not shown).

In the coating/developing system thus constructed, the wafer W stored in the cassette C is first transferred to the process portion 2. Then, the wafer W is washed in the washing unit 21 and the water washing unit 22, subjected to the adhesion unit 23. In the adhesion unit 23, hydrophobic treatment is applied to the wafer W to enhance fixing properties of resist. After cooled in the cooling unit 24, the wafer W is coated with resist in the coating unit 25. Thereafter, the wafer W is prebaked in one of the baking units 26, cooled in the cooling unit 27, transferred to the light-exposure device via the interface portion 30. In this manner, pattern-exposure is accomplished. The pattern-exposed wafer W is transferred from the light-exposure device to the process portion 2 via the interface portion 30 to perform PEB in one of the baking units 26. In the case where the chemically amplified resist is coated on the wafer W, all reactions required for the pattern formation are completed up to the step of the PEB process. Afterward, the wafer W is cooled in the cooling unit 27 and developed in the developing unit 29. In this manner, a predetermined circuit pattern is formed. After rinsed and dried, the processed wafer W is stored in a predetermined cassette C of the cassette station 1 by the sub arm mechanism 3.

Now, the baking unit 26 will be explained.

Figure 2:
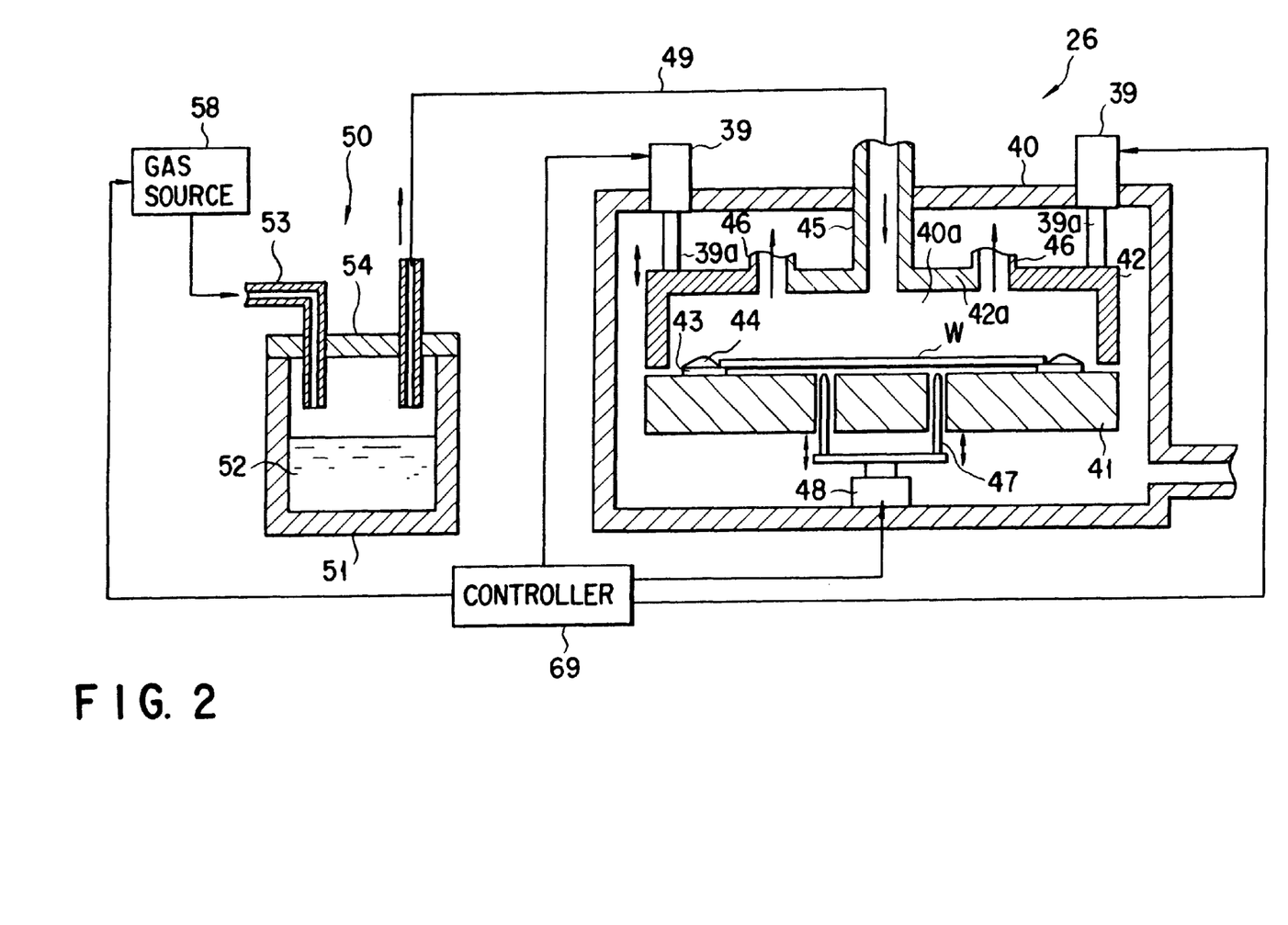
FIG. 2 is a schematic sectional view of a baking apparatus according to an embodiment of the present invention.

As shown in FIG. 2, the baking unit 26 has a casing 40 in which a hot plate 41 for heating the wafer W is placed horizontally. The hot plate 41 is provided with a power controllable heater (not shown).

A plurality of spacers 44 are provided on the surface of the hot plate 41. The wafer W is held by the spacers 44. More specifically, the wafer W is not brought in direct contact with the hot plate, so that the wafer W is baked by heat radiation from the hot plate. By virtue of the indirect baking manner (or called "proximity manner"), the wafer W is protected from contamination ascribed to the hot plate 41. The wafer is aligned by the aligning members 43 fixed on the spacer 44 by screws. The wafer is held by the aligning members 43 in a drop-in manner.

The hot plate 41 has a plurality of lift pins 47 which are supported by a moving mechanism 48 in such a way that they can project from or be depressed in the hot plate 47. To load the wafer into the baking unit, the lift pins 47 are first allowed to project from the hot plate 41 upwardly by inserting the arm holder of the main arm mechanism 19 into the baking unit 26. Then, the wafer W is transferred from the arm holder to the lift pins 47, and the lift pins 47 are descended. To unload the wafer, the lift pins 47 are allowed to project from the hot plate 41 upwardly. Then, the arm holder of the main arm mechanism 19 is inserted into the baking unit 26 to descend the lift pins 47. In this manner, the wafer W is transferred onto the arm holder. It should be noted that the lift pins 47 are withdrawn inside the hot plate 41 during the baking.

A cover 42 is provided above the hot plate 41. The cover 42 is connected to a rod 39a of a movable cylinder 39. When the cover 42 is descended so as to cover the entire surface of the hot plate 41, a baking space 40a is produced between the cover 42 and the wafer W. When the wafer W is loaded/unloaded, the cover 42 is moved upwards.

A gas inlet 45 is provided at the center of and a gas outlet 45 at both ends of the upper plate 42a of the cover 42. A humidified gas is introduced into the baking space 40a through the gas inlet 45 and exhausted from the gas outlet 46, as described later. A pipe 49 is connected to the gas inlet 45 at one end. The other end of the pipe 49 is connected to a humidifying mechanism 50.

The humidifying mechanism 50 has a pot 51 storing pure water 52. A cover 54 is provided at the upper end portion of the pot 51. The pipe 49 and a gas supply pipe 53 are inserted to the pot 51 through the cover 54. The gas supply pipe 53 is connected to a nitrogen gas source 58.

In the heating unit 26 thus constructed, a semiconductor wafer W is mounted on the hot plate 41 and the cover is descended. Subsequently, a nitrogen gas is supplied into the pot 51 of the humidifying mechanism 50 by way of the nitrogen gas pipe 52 from the nitrogen gas source 58. By virtue of the pressure produced when the nitrogen gas is supplied into the pot 51, the nitrogen gas humidified with the pure water 52 stored in the pot 51 is supplied to the space 40a from the gas inlet 45 by way of the nitrogen gas pipe 49. The humidified nitrogen gas thus supplied is evacuated from the space 40a through the outlet 46. When power is supplied to the heater provided in the hot plate 41 while keeping this state, the wafer W is heated. In this case, if the amount of the nitrogen gas supply and temperature are appropriately controlled, the nitrogen gas can be supplied with a desirable humidity. Since the humidified nitrogen gas is exhausted from the space 40a through the outlet 46 provided upwards, the exhaustion air flow will not have adverse effects on the wafer W.

As mentioned above, the necessary reactions of the chemically amplified resist can be carried out stably in the PEB process by introducing the humidified gas into the process space 40a, with the result that a circuit pattern is formed without fail. The chemical reactions of the light-exposed portion of the chemically amplified resist can be completed in the PEB process. However, the chemical reactions can be performed stably if the humidified gas is allowed to reacted with the chemically amplified resist, since the chemical reactions requires water. In this case, the reactions can proceed sufficiently if the supplied gas has a relative humidity of 30% or more. For sufficient proceeding of the reactions, it is preferable to set the baking time within the range of 60 to 90 seconds. The baking unit 26 having the aforementioned structure may be installed in the system and used exclusively for PEB process. Alternatively, when the PEB is performed, the humidified gas may be supplied only to one of the identically constructed baking units which have been installed in the system.

When the chemically amplified resist is subjected to the PEB process, the reaction is influenced by the presence of $H_2O$. It is thus considerable that the line width may be varied depending upon the relative humidity of the atmosphere used in PEB. Therefore, it is effective to control the humidity in order to suppress difference in the line width. If not only the humidity but also the temperature is controlled, the degree of the variance in the line width can be reduced more effectively.

The same humidity/temperature control as performed in the aforementioned humidity/temperature controlling portion 55 has been carried out in the coating unit 25 in the conventional baking apparatus, the humidity/temperature controlled gas in the coating unit 25 may be introduced into the casing 40 through the gas inlet 45a by way of a pipe connecting to the coating unit 25.

Another embodiment of the present invention will be described below. Explanation for portions of this embodiment in common with those of the aforementioned embodiment will be omitted.

Figure 3:
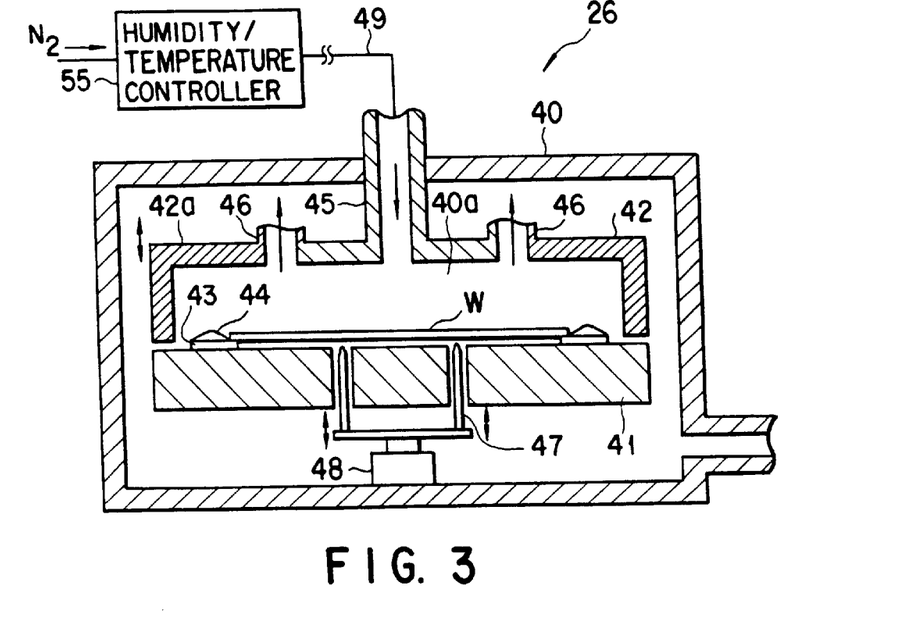
FIG. 3 is a schematic sectional view of a baking apparatus according to another embodiment of the present invention.

As shown in FIG. 3, in the baking unit 26 of this embodiment, the humidity/temperature controlling portion 55 is provided in the middle of the gas supply pipe 49. By virtue of the humidity/temperature controlling portion 55, not only the relative humidity but also the temperature of the PEB process space 40a can be controlled.

Figure 4:
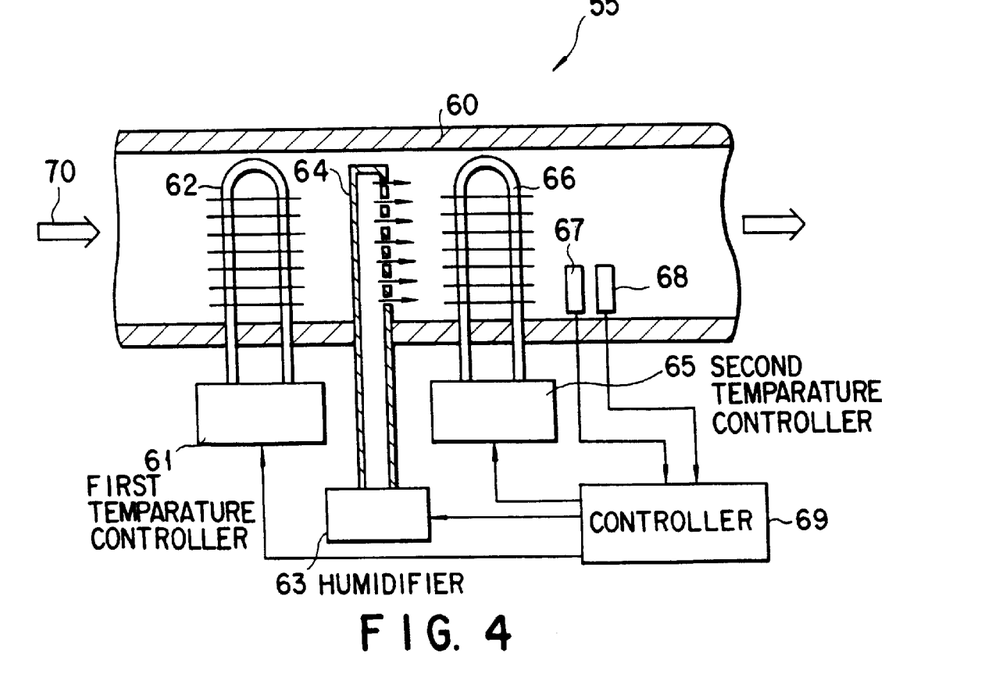
FIG. 4 is a cross sectional view of a humidity/temperature controlling portion used in the baking apparatus of FIG. 3 together with a block diagram of other peripheral instruments.

As shown in FIG. 4, the humidity/temperature controlling portion 55 has a casing 60 communicable with the pipe 49. A nitrogen gas flows in the direction indicated by an arrow 70 in the casing 60. A first heat exchanger 62 and a second heat exchanger 66 are provided in the casing 60 in the flow direction of the nitrogen gas. The first and second heat exchangers 62 and 66 are provided with first and second temperature controllers 61 and 65, respectively. A humidifying pipe 64 extending from a humidifier 63 is provided between the first heat exchanger 62 and the second heat exchanger 66 in the casing 60.

The first and second temperature controllers 61, 65 and the humidifier 63 are connected to a controller 69. A humidity sensor 67 and a temperature sensor 68 are provided downstream of the second temperature controller 66. The humidity/temperature of the supplied gas is controlled in a feed-back fashion by the controller 69 on the basis of the signals received by the sensors 67 and 68.

Figure 5:
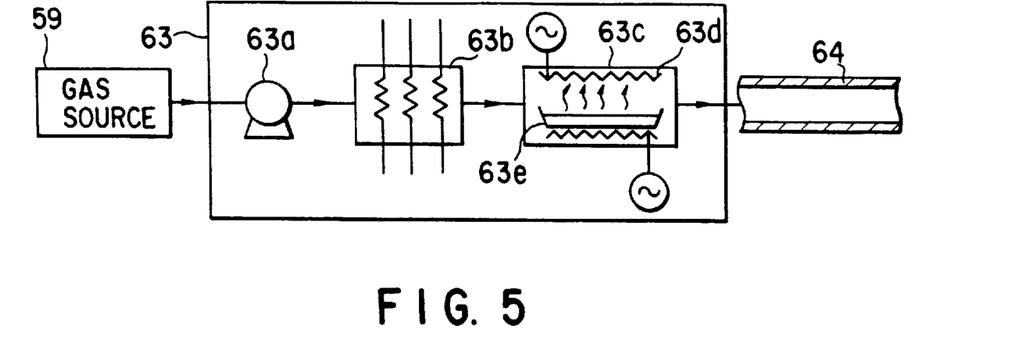
FIG. 5 is a schematic sectional view of a humidifier used in the humidity/temperature controlling portion of FIG. 4.

As shown in FIG. 5, the humidifier 63 comprises a fan 63a, a chiller 63b, and a regulator 63c. The fan 63a plays a role in introducing the nitrogen gas from a nitrogen gas source 59 into the humidifier 63 and sending the gas to the chiller 63b. The chiller 63b exchanges heat of the introduced nitrogen gas with a coolant, thereby removing humidity from the gas. The regulator 63c, which comprises a heater 63d and an evaporating dish 63e, controls the temperature and humidity of the humidity-removed gas by the chiller 63b.

Figure 6:
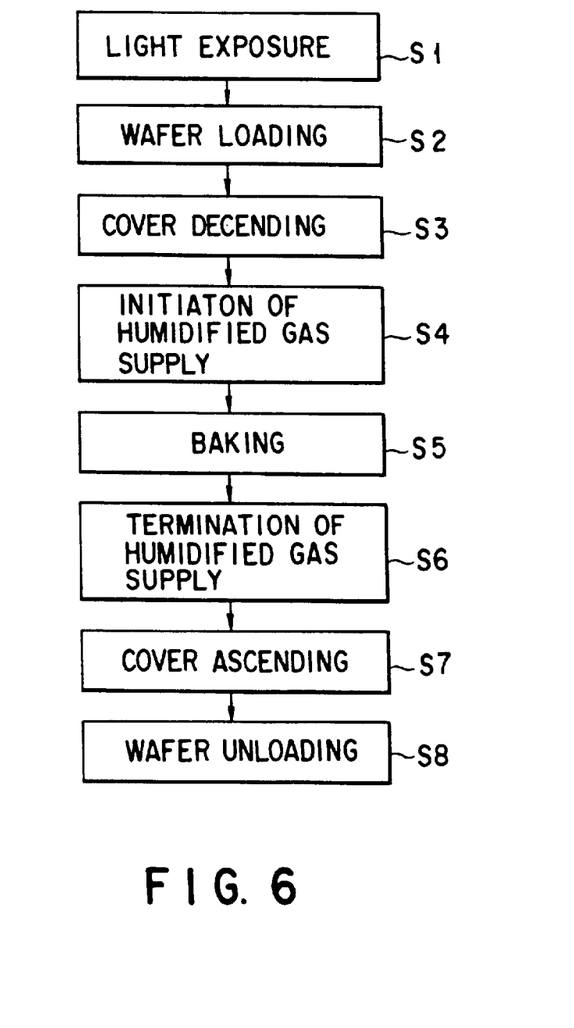
FIG. 6 is a flow chart showing a baking method according to an embodiment of the present invention.

Now, the case where a chemically amplified resist is subjected to the PEB process will be explained with reference to FIG. 6.

A wafer W is spin-coated with the chemically amplified resist in the coating unit 25 and prebaked in the baking unit 26. The wafer W is then loaded into a light exposing apparatus (not shown) and the coated resist is exposed to light (Step S1). As a result, $H^+$ is generated from photoacid generator contained in the resist. Subsequently, the wafer W is transferred from the light exposing apparatus to the second process portion 2b by the second main arm mechanism 19. The main arm mechanism 19 further loads the wafer W into the baking unit 26 and mounts it on the hot plate 41 (Step S2). Thereafter, the cover 42 is descended to form a PEB process space 40a between the cover 42 and the wafer W (Step S3).

Next, the humidified gas supply into the PEB process space 40a (Step S4) is initiated. The relative humidity of the inner atmosphere of the process space 40a is controlled so as to fall within the range of 30 to 50%. After the relative humidity is controlled, power is supplied to the hot plate 41 to bake the wafer W at 90° C. for only 90 seconds (Step S5). By this baking, $H^+$ is freshly generated from the light-exposed portion. Freshly generated $H^+$ accelerates decomposition of a main component of the resist film.

Now, we will explain how to control the humidity and temperature of the supplied gas. The nitrogen gas supplied from the pipe 49 into the casing 60 is cooled to a predetermined temperature by the first heat exchanger 62 which has been set at a lower temperature by the first temperature controller 61. Subsequently, water vapor is supplied from the humidifier 63 through a humidifying pipe 64 into the casing 60 to humidify the nitrogen gas present in the casing 60. The humidified nitrogen gas is heated to a predetermined temperature within the range of 80 to 170° C. by the second temperature controller 66 whose temperature has been set at a predetermined temperature by the second temperature controller 65. In this case, the first and second temperature controllers (61, 65) and the humidifier 63 are controlled by the controller 69 on the basis of the signals detected by the humidity sensor 67 and the temperature sensor 68. Consequently, the humidity and temperature of the nitrogen gas present in the casing 60 are controlled.

After the baking is completed in step S5, the humidified gas supply into the process space 40a is terminated (Step S6). While the cover 42 is being ascended (Step S7), the wafer W is unloaded from the baking unit 26 (Step S8). The wafer W is then loaded into the developing unit 29 to develop the PEB processed resist film. After rinsed and dried, the wafer W is housed in the cassette C.

During these steps, the humidity and temperature are controlled as follows. The nitrogen gas supplied through the pipe 49 to the casing 60 is first cooled to a predetermined temperature by the first heat exchanger 62 whose temperature has been set at a lower value by the first temperature controller 61. Subsequently, water vapor is supplied into the casing 60 via the humidifying pipe 64 from the humidifier 63, thereby humidifying the nitrogen gas present in the casing 60. The humidified nitrogen gas is heated to a predetermined temperature within the range of 80 to 170° C. by the second heat exchanger 66 whose temperature has been set at a predetermined temperature by the second temperature controller 65. In this case, the first and second temperature controllers (61, 65) and the humidifier 63 are controlled by the controller 69 on the basis of the signals detected by the humidity sensor 67 and the temperature sensor 68. As a result, the humidity and temperature of the nitrogen gas present in the casing 60 is controlled.

The humidity/temperature controlled nitrogen gas is supplied to the space 40a through the gas inlet 45 by way of the pipe 49. Since the baking is performed in the humidity/temperature controlled conditions, the chemical reactions of the chemically amplified resist can be carried out highly accurately. As a result, it is possible to obtain an ultra fine pattern having a line width of 0.3 $\mu$m or less with the deviation falling with the range of ±4 to 5% from a desired value, e.g. 0.25 $\mu$m.

Hereinbelow, we will explain the chemical reactions which take place when the chemically amplified resist mainly made of an acetal protected polyhydroxystyrene resin (insoluble in alkali) is subjected to the PEB, with reference to formulas 1-1, 1-2, 2-1, and 2-2. The formulas 1-1 and 2-1 show the chemical reaction when the resist is subjected to the PEB process under general atmospheric conditions. The formulas 1-2 and 2-2 show the chemical reaction when the resist is subjected to the PEB process under the humidified atmospheric conditions.

When the photoresist film is exposed to light, $H^+$ is generated from the photoacid generator contained in the resist. Thereafter, when the wafer W is heated in the PEB process, an acetal group is cut out and isolated from polyhydroxystyrene (PHS) by $H^+$ present at the light-exposed portion. PHS is soluble in alkali. On the other hand, the isolated acetal group presents in the form of a carbocation represented by a resonance structure (1) or (2). Since the carbocations (1) and (2) are labile intermediate products, they readily decompose and freshly generate $H^+$. The generated $H^+$ decomposes the carbocations. $H^+$ is thus consecutively generated in a chain reaction manner. As described, when the chemically amplified resist is subjected to PEB, $H^+$ is produced one after another. Therefore, even if the film is exposed to even low energy eximer laser, the resultant pattern is obtained with high sensitivity.

When the chemically amplified resist is subjected to the PEB process under the humidified atmosphere, $H_2O$ works actively to decompose carbocation (1) or (2) as shown in the formulas 1-2 and 2-2. To explain more specifically, $H_2O$ reacts with the carbocation (1) or (2), converting it into a tautomer. The tautomer is further decomposed into alcohol and aldehyde. The decomposed products (alcohol and aldehyde) are easily vaporized leaving alkali soluble PHS alone. When alkaline developing solution is applied to the portion substantially consisting of PHS, the resist is completely dissolved without debris. As a result, a clear-cut pattern is successfully obtained having constant line width.

Figure 7:
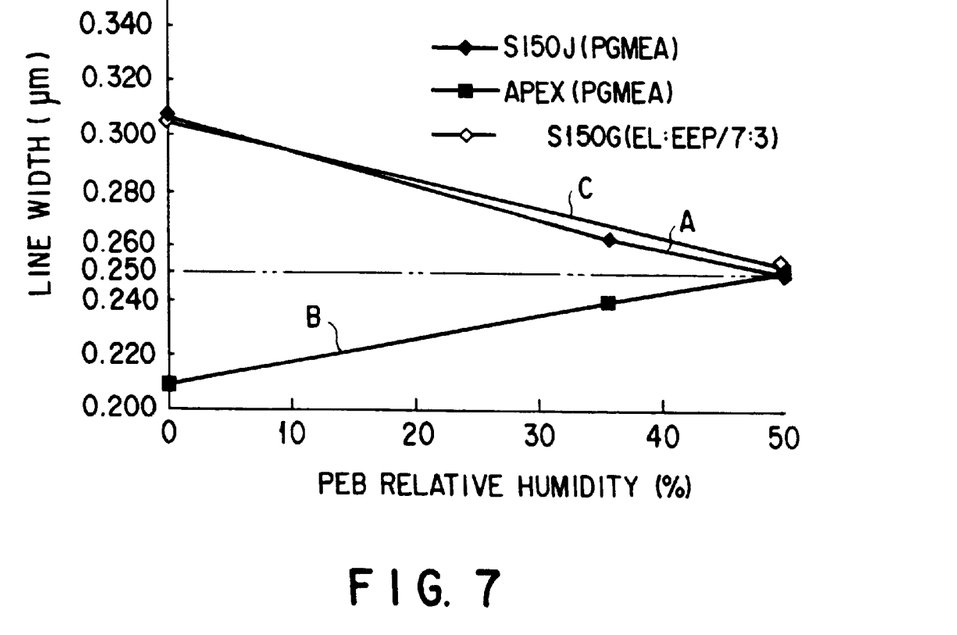
FIG. 7 is a characteristic graph showing the effect of a PEB relative humidity on the line width of a resist pattern.

FIG. 7 is a characteristic graph showing the effects of a moisture content in the atmosphere during the PEB process (hereinafter referred to as "PEB relative humidity") upon the line width. The PEB relative humidity (%) of the atmosphere is plotted on the abscissa and line width ($\mu$m) of the circuit pattern is plotted on the ordinate. Resist samples 1 to 3 were checked. Characteristic lines A, B, C shows the results of resist samples 1, 2, and 3, respectively.

Sample 1 is prepared by dissolving S150J in an appropriate amount of a solvent, propylene glycol monomethylether acetate (PGMEA). S150J used herein is a commercially available resist made of an acetal protected resin, manufactured and sold by JAPAN SYNTHETIC RUBBER Co. Ltd. Sample 2 is prepared by dissolving APEX in an appropriate amount of PGMEA. APEX used herein is a commercially available resist made of a tertiary butoxycarbonyl(t-BOC) group, manufactured and sold by IBM. Sample 3 is prepared by dissolving S150G in an appropriate amount of a solvent consisting of ethyl lactate and ethyl-3-etoxypropionate (EEP) in a ratio of 7:3. S150G used herein is a commercially available resist made of an acetal protected resin, manufactured and sold by JAPAN SYNTHETIC RUBBER Co. Ltd.

The baking were made at the most suitable temperature (e.g. 90° C.) for each resist within the range of 80 to 170° C. for 90 seconds. The relative humidity during the PEB process (PEB relative humidity) was adjusted to at most 50% by controlling the amount of water vapor to be supplied to the baking process space 40a. The PEB relative humidity was measured at the gas inlet 45. A desired line width was set as 0.25 $\mu$m.

As is apparent from FIG. 7, the line widths of Samples 1 and 3 gradually decreases in a similar fashion with an increase of the PEB relative humidity, whereas that of Sample 2 gradually increases.

Figure 8:
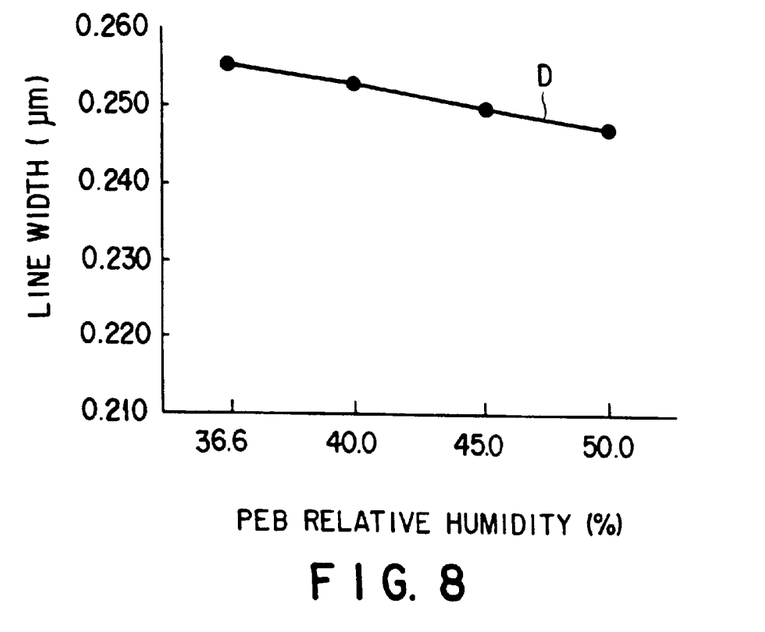
FIG. 8 is a characteristic graph showing the effect of a PEB relative humidity on the line width of another resist pattern.

FIG. 8 is a characteristic graph showing the effects of a moisture content during the PEB upon the resist. The relative humidity of the atmosphere during the PEB is plotted on the abscissa. The line width ($\mu$m) of the circuit pattern is plotted on the ordinate. Characteristic line D in the figure shows the results of Sample 4. Sample 4 is prepared by adding "TDUR-P007" in a solvent, PGMEA. TDUR-P007 is a commercially available resist made of an acetal protected resin and manufactured and sold by TOKYO OHKA KOGYO Co. Ltd. The baking was carried out at a temperature of 110° C. for 90 seconds. The PEB relative humidity was adjusted within the range of 36.6% to 50% by controlling an amount of water vapor to be supplied to the baking space 40a. The relative humidity of the atmosphere during the baking was measured at the gas inlet 45. A desired line width is set at 0.25 $\mu$m.

As is apparent from FIG. 8, in Sample 4, the line width of 0.255 $\mu$m is obtained when the PEB relative humidity is 36.6%. The line width of 0.253 $\mu$m is obtained at the PEB relative humidity of 40%, the line widths of 0.250 $\mu$m and 0.247 $\mu$m are obtained at PEB relative humidities of 45% and 50%, respectively.

The present invention is not limited to the aforementioned embodiments and can be modified in various ways. Various mechanisms can be considered for supplying the humidified gas and for controlling humidity and temperature. Therefore, such mechanisms are not limited to those mentioned in the above embodiments. Furthermore, usable gas is not limited to a nitrogen gas. Any gas including air can be used as long as it has no effects on the substrate.

Although the present invention is particularly efficiently applied to the case where a chemically amplified resist is used, it can be applied to the case where another resin such as a novolac resin is used. In the aforementioned embodiments, a semiconductor wafer is used a substrate. However, the present invention is not limited to the semiconductor wafer and it can be applied to a glass substrate for liquid crystal display.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for baking a chemically amplified resist film after exposure and before development in a photolithography process, comprising the steps of:

(a) placing a substrate having a pattern-exposed chemically amplified resist film on a hot plate, and disposing a cover having a gas outlet above the hot plate, thereby forming a space around the substrate in order to process the substrate such that the space is substantially enclosed;

(b) generating a $H_2O$ component containing humidity gas by adding steam to gas, and (c) heating the substrate with the hot plate while the humidity gas is being introduced in the space for processing to react the $H_2O$ component contained in the humidity gas with the resist film, and exhausting the humidity gas from the space through the gas outlet, thereby rendering an irradiated portion or a non-irradiated portion of the resist film soluble in alkali.

2. The method according to claim 1, wherein step (c) further comprises the step of heating the substrate to a temperature within the range of 80° C. to 170° C.

3. The method according to claim 1, wherein step (c) further comprises the step of heating the substrate for only 70 to 150 seconds.

4. The method according to claim 1, wherein step (b) further comprises the step of generating the humidity gas by adding water vapor to an inert gas.

5. The method according to claim 1, wherein step (c) further comprises the step of controlling a relative humidity of the space for processing within the range of 30 to 50% by controlling an amount of the humidity gas.

6. The method according to claim 1, wherein step (b) further comprises the step of controlling a temperature of the humidity gas to fall within a range of 80 to 170° C.

* * * * *